United States Patent

Park

[11] Patent Number: 5,866,435
[45] Date of Patent: Feb. 2, 1999

[54] METHODS OF FABRICATING PROFILED DEVICE ISOLATION TRENCHES IN INTEGRATED CIRCUITS

[75] Inventor: Moon-han Park, Kyungki-do, Rep. of Korea

[73] Assignee: Samsung Electronics Co., Ltd., Suwon, Rep. of Korea

[21] Appl. No.: 681,709

[22] Filed: Jul. 29, 1996

[30] Foreign Application Priority Data

Aug. 31, 1995 [KR] Rep. of Korea .................. 1995 28484

[51] Int. Cl.⁶ ...................................................... H01L 21/76
[52] U.S. Cl. ................................. 437/65; 437/67; 437/924
[58] Field of Search ................................. 437/64, 67, 65, 437/228 TR, 228 M, 228 S, 924, 984, 981; 146/DIG. 161

[56] References Cited

U.S. PATENT DOCUMENTS

| | | |
|---|---|---|
| 4,495,025 | 1/1985 | Haskell . |
| 4,577,395 | 3/1986 | Shibata . |
| 4,707,218 | 11/1987 | Giamarco et al. . |
| 4,857,477 | 8/1989 | Kanamori . |

*Primary Examiner*—George R. Fourson
*Attorney, Agent, or Firm*—Myers Bigel Sibley & Sajovec, L.L.P.

[57] ABSTRACT

A device isolation trench is formed in a semiconductor substrate by forming spaced apart masking regions on the substrate, leaving an exposed portion of the substrate disposed therebetween. A masking layer is formed on the masking regions and the exposed portion of the substrate. The masking layer and the substrate are then anisotropically etched for an etching time sufficient to remove the masking layer and portions of the substrate disposed between the masking regions and thereby form a device isolation trench in the substrate having rounded edges. Preferably, the step of anisotropically etching includes etching with an etchant that etches the substrate and the masking layer at approximately the same etching rate. More preferably, the substrate is silicon and the masking layer is polysilicon or amorphous silicon. The masking layer may also be high-thermal oxide (HTO) having an etching rate lower than that of the substrate. The masking regions preferably are formed from a third material having an etching rate different from that of the substrate, more preferably silicon nitride. The masking regions may be formed by forming a first layer on the substrate, forming a second layer on the substrate, and patterning the first and second layers to expose an underlying portion of the substrate and form spaced apart masking regions disposed on opposite sides of the exposed portion of the substrate. Preferably, the first layer includes silicon dioxide and the second layer includes silicon nitride.

18 Claims, 5 Drawing Sheets

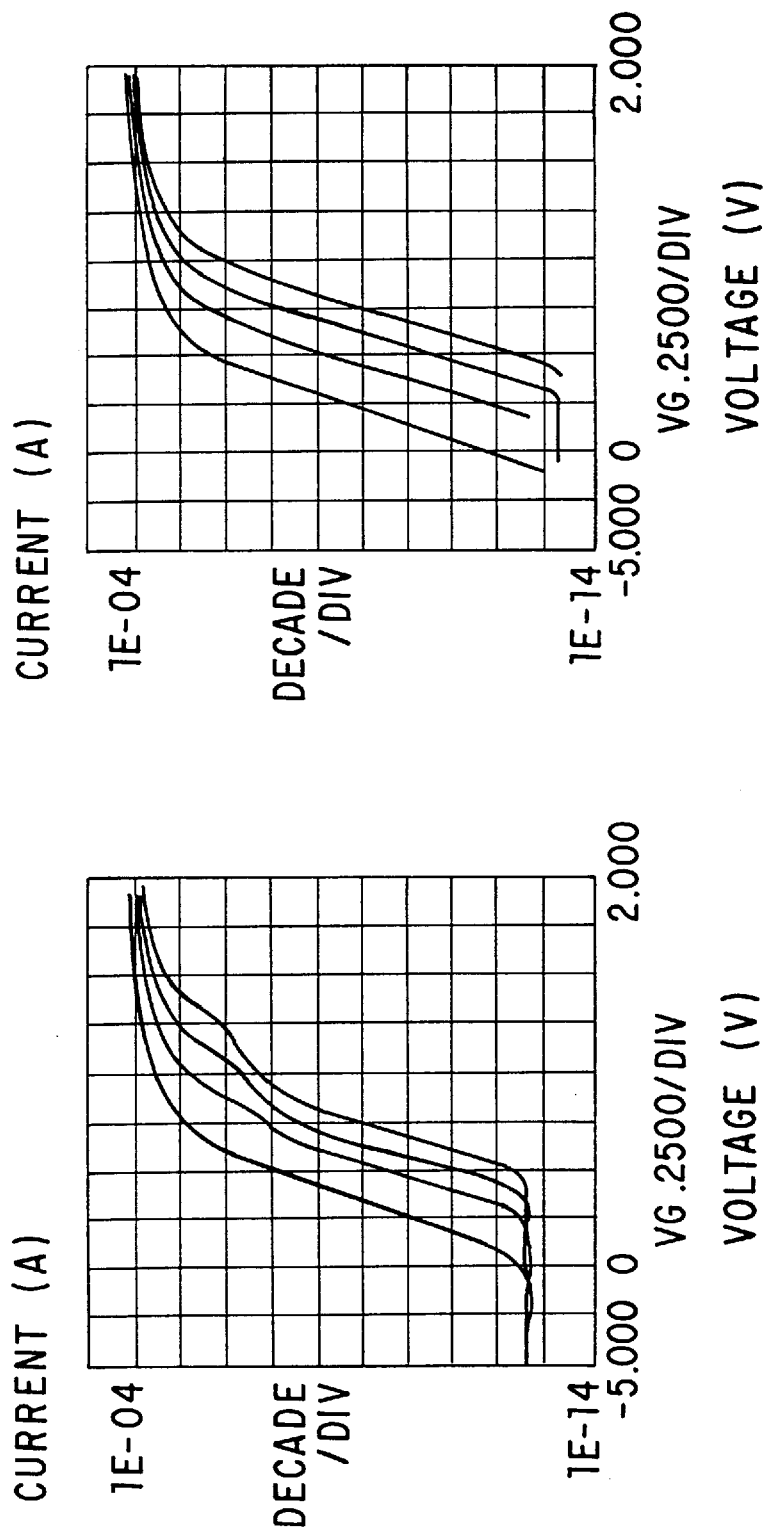

METHODS OF FABRICATING PROFILED DEVICE ISOLATION TRENCHES IN INTEGRATED CIRCUITS

FIELD OF THE INVENTION

The present invention relates to integrated circuit fabrication methods, more particularly, to methods of fabricating device isolation regions for integrated circuits.

BACKGROUND OF THE INVENTION

Increasing the density of integrated circuit devices generally requires reduction of the size of the transistors used in the devices in order to incorporate more transistors into the integrated circuit. To reduce the size of the transistors, it is generally desirable to reduce the area of the active regions in the integrated circuit. In addition, it generally is desirable to reduce the area of the device isolation regions used to separate the active regions of the integrated circuit.

One technique for forming device isolation regions involves the local oxidation of silicon (LOCOS). According to this technique, an insulating oxide layer is grown between active regions by thermally oxidizing silicon substrate regions between the active regions. However, as the oxidation process tends to extend laterally across the face of the substrate as well as vertically into the regions, so-called "bird's beaks" may be produced at the edges of the active regions which may encroach on and undesirably narrow the active regions. In addition, the heat treatment used for oxidation may induce defects in the substrate silicon through heat stress and thermal diffusion of ion-implanted impurities.

An alternative to LOCOS techniques are trench isolation methods wherein a trench is formed in a semiconductor substrate and filled with an insulating material such as silicon dioxide. Although trench isolation can provide effective isolation between devices, the profile of the side walls of the trench may effect the stability of the devices. As illustrated in FIGS. 1A–1B, a transistor isolated by a trench having a sharp upper edge as in FIG. 1A may exhibit the undesirable drain current vs. gate voltage characteristic shown in FIG. 1B. A concentration of the electric field near the sharp edge of the trench may cause a "hump" as illustrated in FIG. 1B. The hump may lead to undesirable operating characteristics, e.g., a stepped gate voltage turn-on characteristic for some source to drain voltage levels. In FIG. 2A, a trench having rounded upper edges is illustrated, with FIG. 2B illustrating improved drain current vs. gate voltage characteristics produced by the rounded-edge trench.

A conventional technique for forming a rounded-edge trench is described in U.S. Pat. No. 4,857,477 to Kanamori. As illustrated in FIGS. 3A–3C, this technique includes sequentially forming an oxide layer and a first mask layer on a substrate 10 and patterning the first mask layer and the oxide layer to expose a portion of the substrate 10 between masking regions 14. Spacers 16 are then formed by forming a second masking layer on the substrate and anisotropically etching the second masking layer to leave the spacers 16 disposed adjacent the masking regions 14. The substrate 10 is then etched using the spacers 16 and the mask layer 14 as a mask to form a trench 18. The spacers 16 are then removed, and the exposed substrate portions etched, typically using a rapid dry-etching technique, to form rounded edges A.

Although this technique effectively produces a rounded-edge trench, the processes involved are generally complicated, typically requiring multiple photomasking and etching steps. The large number of steps may undesirably increase the time and expense required to manufacture the integrated circuit.

SUMMARY OF THE INVENTION

In light of the foregoing, it is an object of the present invention to provide methods for fabricating rounded-edge device isolation trenches which are less complex and time-consuming than conventional processes.

This and other objects, features and advantages are provided, according to the present invention, by methods for fabricating rounded-edge device isolation trenches in a semiconductor substrate in which a masking layer is formed over spaced apart masking regions formed on the substrate and an exposed portion of the substrate between the regions, and the masking layer and underlying substrate are anisotropically etched for an etching time sufficient to remove the masking layer and form a device isolation trench in the substrate, the device isolation trench having rounded edges. Preferably, the substrate and the masking regions are formed from materials having different etching rates, with the substrate preferably including silicon and the masking regions preferably including silicon nitride. The masking layer preferably is formed from a material having an etching rate approximately the same as the substrate, preferably polysilicon or amorphous silicon. The present invention thus can provide simpler and more efficient methods of forming rounded-edge device isolation trenches than conventional techniques.

In particular, according to the present invention, a device isolation trench is formed in a semiconductor substrate by forming spaced apart masking regions on the substrate, leaving an exposed portion of the substrate disposed therebetween. A masking layer is then formed on the exposed portion of the substrate and on the masking regions. The masking layer and portions of the substrate between the masking regions are then anisotropically etched for an etching time sufficient to remove the masking layer and form a device isolation trench in the substrate. Preferably, the etching step produces a device isolation trench having rounded edges. The etching step also preferably includes etching with an etchant that etches the substrate at a first rate and the masking layer at second rate approximately the same as the first rate. More preferably, the substrate includes silicon and the masking layer includes one of polysilicon and amorphous silicon. The masking regions preferably include a material having an etching rate different from that of the substrate, preferably silicon nitride.

The masking regions may be formed by forming a first layer on the substrate, forming a second layer on the first layer, and patterning the second layer and the first layer to expose an underlying portion of the substrate and form spaced apart masking regions disposed on opposite sides of the exposed portion of the substrate. Preferably, the first layer includes silicon dioxide, such as a thermal oxide film, and the second layer includes silicon nitride. Simplified methods for forming rounded-edge device isolation trenches are thereby provided.

BRIEF DESCRIPTION OF THE DRAWINGS

Some of the objects and advantages of the present invention having been stated, others will be more fully understood from the detailed description that follows and by reference to the accompanying drawings in which:

FIG. 1B is a diagram illustrating drain current characteristics of a sharp-edge trench according to FIG. 1A;

FIG. 2B is a chart illustrating drain current characteristics of a rounded-edge trench according to FIG. 2A;

DETAILED DESCRIPTION

Figure 1A:
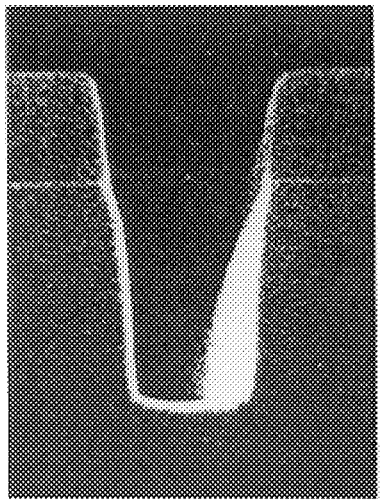
FIG. 1A is a scanning electron microscope (SEM) photomicrograph of a sharp-edged trench.
Figure 2A:
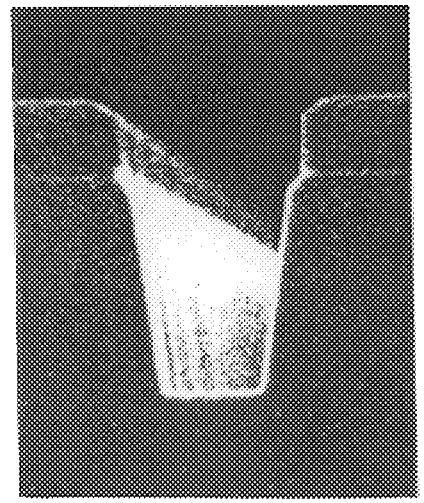
FIG. 2A is an SEM photomicrograph of rounded-edge trench.
Figure 3A:
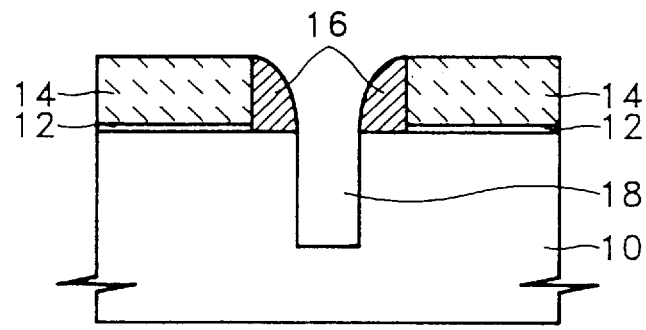
FIGS. 3A–3C are cross-sectional views of a substrate illustrating a technique for forming a rounded-edge device isolation trench according to the prior art.
Figure 3B:
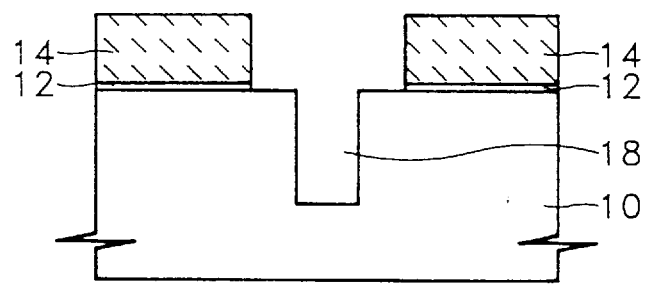
Figure 3C:
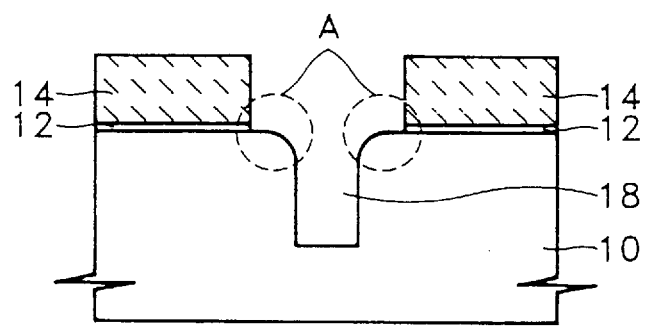

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 4A:
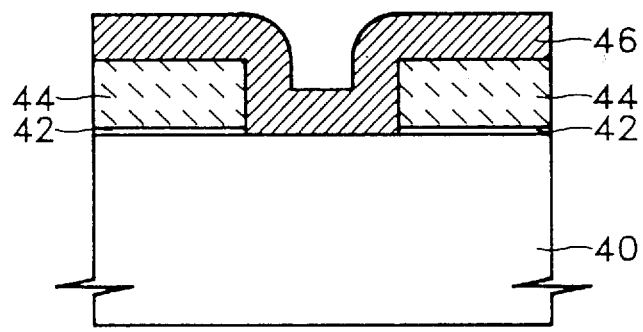
FIGS. 4A–4E are cross-sectional views of intermediate fabrication products illustrating steps for forming a rounded-edge device isolation trench in a substrate according to the present invention.

FIG. 4A illustrates steps for forming spaced apart masking regions 44 and an overlying masking layer 46 on a substrate 40 according to the present invention. Preferably, first and second layers are sequentially formed on the substrate 40, which preferably includes silicon. The first layer preferably includes a silicon dioxide film formed, for example, by thermal oxidation of the substrate 40 to a depth of 400 Ångstroms or less. The second layer, from which the masking regions 44 are formed, preferably comprises silicon nitride formed to a thickness of approximately 1000 Ångstroms to approximately 4000 Ångstroms, thus providing masking regions 44 which etch at a different rate than the substrate 40. The first and second layers are then patterned to form the spaced apart masking regions 44 overlying spaced apart insulating regions 42, with an exposed portion 40a of the substrate 40 disposed between the masking regions 44. A masking layer 46 is then formed on the masking regions 44 and the exposed portion 40a of the substrate 40, preferably a polysilicon or amorphous silicon layer formed to a thickness of approximately 1000 Ångstroms to approximately 5000 Ångstroms.

Figure 4B:
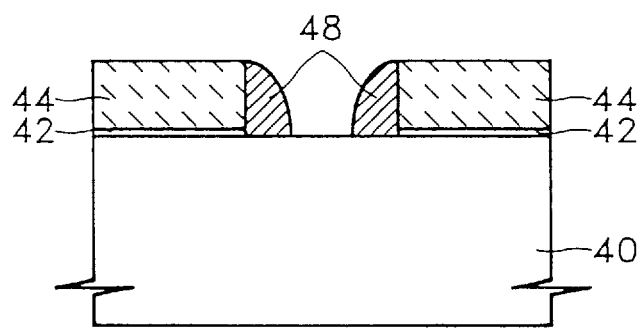
Figure 4C:
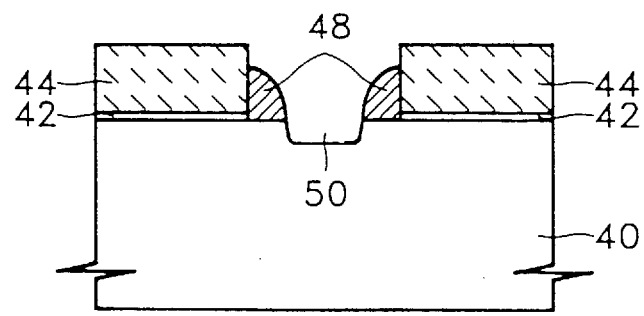
Figure 4D:
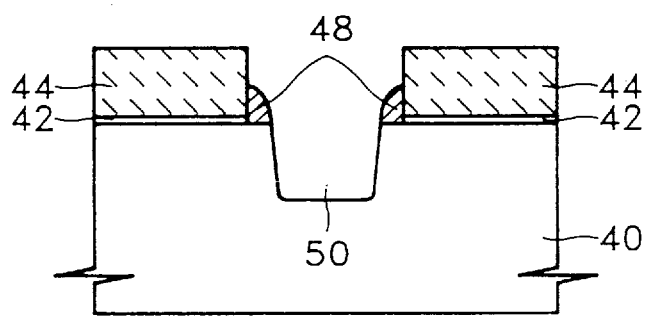
Figure 4E:
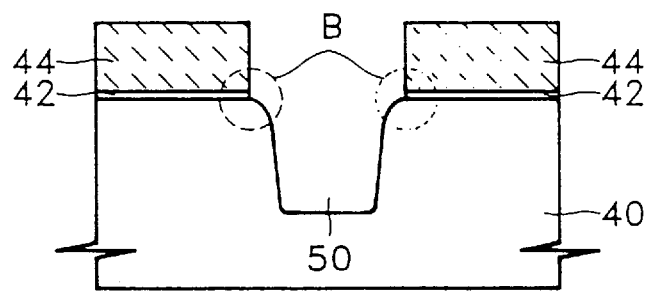

FIGS. 4B–4E illustrate operations for forming a rounded-edge device isolation trench according to the present invention. In particular, FIGS. 4B–4E illustrate the progressive anisotropic etching of the masking layer 48 and underlying portions of the substrate 40 to remove the masking layer 48 and therefrom form a substrate 40 having a device isolation trench 50 with rounded edges B formed therein as illustrated in FIG. 4E. As illustrated in FIGS. 4B, the anisotropic etching forms a pair of spacers 48 on side wall portions of the masking regions 44. As the masking layer 46, and thus the spacers 48, preferably etch at approximately the same rate as the substrate 40, the edges of the device isolation trench 50 are gradually rounded as the spacers 48 are etched away. However, rounded-edged device isolation trenches may also be formed according to the present invention by using a masking layer 46 which has a lower etching rate than that of the substrate 40, for example, a high-temperature thermal oxide (HTO) layer.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming a device isolation trench in a semiconductor substrate, comprising the steps of:

forming spaced apart masking regions on the semiconductor substrate, leaving an exposed portion of the semiconductor substrate disposed therebetween;

forming a masking layer on the masking regions and on the exposed portion of the semiconductor substrate; and anisotropically etching the masking layer and the semiconductor substrate for an etching time sufficient to remove the masking layer and form a device isolation trench in the semiconductor substrate.

2. A method according to claim 1 wherein the device isolation trench has rounded edges.

3. A method according to claim 1 wherein the step of anisotropically etching comprises the step of etching with an etchant that etches the semiconductor substrate at a first rate and the masking layer at a second rate approximately the same as the first rate.

4. A method according to claim 1 wherein the semiconductor substrate comprises silicon and the masking layer comprises one of polysilicon, amorphous silicon, and high-temperature thermal oxide (HTO).

5. A method according to claim 1 wherein the masking layer comprises one of a polysilicon layer and an amorphous silicon layer and has a thickness of approximately 1000 Ångstroms to approximately 5000 Ångstroms.

6. A method according to claim 1 wherein the masking regions comprise silicon nitride.

7. A method according to claim 1 wherein said step of forming spaced apart masking regions comprises the steps of:

forming a first layer on the semiconductor substrate;

forming a second layer on the first layer; and patterning the second layer and the first layer to expose an underlying portion of the semiconductor substrate and to form spaced apart masking regions disposed on opposite sides of the exposed portion of the semiconductor substrate.

8. A method according to claim 7 wherein the first layer is silicon dioxide and wherein the second layer is silicon nitride.

9. A method according to claim 7 wherein the second layer comprises a silicon nitride layer having a thickness of approximately 1000 Ångstroms to approximately 4000 Ångstroms.

10. A method of forming a trench in a substrate, comprising the steps of:

forming spaced apart masking regions on the substrate, leaving an exposed portion of the substrate disposed therebetween;

forming a masking layer on the masking regions and on the exposed portion of the substrate; and anisotropically etching the masking layer and the substrate for an etching time sufficient to remove the masking layer and form a trench in the substrate.

11. A method according to claim 10 wherein the trench has rounded edges.

12. A method according to claim 10 wherein the step of anisotropically etching comprises the step of etching with an etchant that etches the substrate at a first rate and the masking layer at a second rate approximately the same as the first rate.

13. A method according to claim 10 wherein the substrate comprises silicon and the masking layer comprises one of polysilicon, amorphous silicon, and high-temperature thermal oxide (HTO).

14. A method according to claim 10 wherein the masking layer comprises one of a polysilicon layer and an amorphous silicon layer and has a thickness of approximately 1000 Ångstroms to approximately 5000 Ångstroms.

15. A method according to claim 10 wherein the masking regions comprise silicon nitride.

16. A method according to claim 10 wherein said step of forming spaced apart masking regions comprises the steps of:

forming a first layer on the substrate;

forming a second layer on the first layer; and patterning the second layer and the first layer to expose an underlying portion of the substrate and to form spaced apart masking regions disposed on opposite sides of the exposed portion of the substrate.

17. A method according to claim 16 wherein the first layer is silicon dioxide and wherein the second layer is silicon nitride.

18. A method according to claim 16 wherein the second layer comprises a silicon nitride layer having a thickness of approximately 1000 Ångstroms to approximately 4000 Ångstroms.

* * * * *